(12) United States Patent
Antu et al.

(10) Patent No.: US 7,312,402 B2
(45) Date of Patent: Dec. 25, 2007

(54) METHOD AND APPARATUS FOR PROVIDING IMPROVED LOOP INDUCTANCE OF DECOUPLING CAPACITORS

(75) Inventors: Rafael Antu, Antioch, CA (US); Cathy Marie Drews, Morgan Hill, CA (US); David A. Plomgren, San Carlos, CA (US); Todd Edward Takken, Mt. Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 238 days.

(21) Appl. No.: 10/269,404

(22) Filed: Oct. 11, 2002

(65) Prior Publication Data

US 2004/0070956 A1    Apr. 15, 2004

(51) Int. Cl.
*H05K 1/16* (2006.01)
*H01K 3/10* (2006.01)

(52) U.S. Cl. ............................ 174/260; 29/834; 29/852
(58) Field of Classification Search ................ 174/260, 174/262–266; 361/767–779; 29/834–836, 29/852–853
See application file for complete search history.

(56) References Cited

U.S. PATENT DOCUMENTS

| | | |
|---|---|---|
| 4,853,826 A | 8/1989 | Hernandez |
| 4,882,656 A * | 11/1989 | Menzies et al. ............ 361/734 |
| 4,945,399 A | 7/1990 | Brown et al. |
| 5,132,613 A | 7/1992 | Papae et al. |
| 5,459,642 A * | 10/1995 | Stoddard ................... 361/774 |
| 5,731,960 A * | 3/1998 | Fung .......................... 361/782 |
| 5,811,868 A | 9/1998 | Bertin et al. |
| 5,996,880 A | 12/1999 | Chu et al. |
| 6,061,228 A | 5/2000 | Palmer et al. |
| 6,084,779 A | 7/2000 | Fang |
| 6,337,798 B1 | 1/2002 | Hailey et al. |
| 6,596,948 B1 * | 7/2003 | Haden et al. ............... 174/262 |

FOREIGN PATENT DOCUMENTS

JP    2001068583    3/2001

OTHER PUBLICATIONS

Feinberg et al., "Low Inductance Decoupling Capacitor Connection," IBM Technical Disclosure Bulletin, vol. 28, No. 7, Dec. 1985, pp. 2827.

(Continued)

*Primary Examiner*—Jeremy C Norris
(74) *Attorney, Agent, or Firm*—David W. Lynch; Chambliss, Bahner & Stophel (57) ABSTRACT

A method and apparatus that provides improved loop inductance of decoupling capacitors. Vias are moved close to the pads and close to each other. Instead of placing power and ground vias on opposite sides of the capacitor, these vias are moved around to the same side of the capacitor and are placed as close to each other as manufacturing tolerances will allow. For designs using standard two-terminal surface mount capacitors, two vias per capacitor, and standard manufacturing procedures (no vias inside pads, for example), the lowest possible loop inductance of the capacitor's connections to the printed circuit board planes is provided. This results in the lowest effective capacitor series input inductance.

25 Claims, 5 Drawing Sheets

OTHER PUBLICATIONS

Churchwell et al., "Low Inductance Chip Carrier With Decoupling Capacitors," IBM Technical Disclosure Bulletin, vol. 30, No. 4, Sep. 1987, pp. 1786, 1787.

Parisi, "Decoupling Capacitor Placement," IBM Technical Disclosure Bulletin, vol. 19, No. 8, Jan. 1977, pp. 3046-3047.

"Method, System, And Program For Error Checking Raster Objects," patent application filed Dec. 19, 2000, having U.S. Appl. No. 09/741,455.

* cited by examiner

METHOD AND APPARATUS FOR PROVIDING IMPROVED LOOP INDUCTANCE OF DECOUPLING CAPACITORS

BACKGROUND OF THE INVENTION

1. Field of the Invention

This invention relates in general to decoupling capacitors for integrated circuits, and more particularly to a method and apparatus for providing improved loop inductance of decoupling capacitors.

2. Description of Related Art

Recent developments in integrated circuit technologies have led to higher levels of performance and faster operation speeds and, also, have led to the development of more complex integrated circuits (ICs). These and other achievements and increased levels of complexity has made it more and more difficult to maintain the power source level applied to an integrated circuit (IC) within a prescribed range. For example, technological achievements in integrated circuit technologies have driven the operating frequencies (e.g., clocking speeds) to much higher levels and, correspondingly, are driving voltages as well as noise margins lower and lower.

Surface mount capacitors are typically mounted close to logic chips on nearly all Printed Circuit Board (PCB) designs. These capacitors serve as temporary, low inductance current supplies to the nearby logic devices which are drawing current between the PCB power and ground planes. In this way the capacitors decouple the two main functions of the power and ground planes: supplying DC current and controlling high frequency noise. The ability of the capacitors to provide temporary AC shorts between planes also enables return currents to flow uninterrupted near signal lines when the signal lines switch layers in a printed circuit board.

Common practice for dealing with power surges and noise problems is to add decoupling capacitors, electrically in parallel, until a sufficiently low inductance path between voltage supply planes is created. This is often accompanied by capacitors that use a range of values. This results in the need for more capacitors of differing values to accomplish a sufficiently low inductance, which adds to product cost and is arguably ineffective.

Decoupling problems are most acute for high performance printed circuit board designs, such as those with high speed logic, impedance controlled interconnect lines, and multiple voltage levels. Problems arise from noise in the voltage supply planes adversely affecting logic chips and from return current discontinuities causing excessive coupling between signal lines.

The series input inductance of an individual, mounted capacitor is due in large part to the relative arrangement of the capacitor's surface mount pads and its via breakouts, which provide connections from the top of the board to the internal voltage planes. However, the placement of the power and ground vias relative to the pads has never been minimized. This results in input inductance that violate today's electrical requirements.

It can be seen then that there is a need for a novel pad and via arrangement which reduces the mounted capacitor's input inductance without violating common manufacturing requirements for certain minimum separations.

It can also be seen that there is a need for a method and apparatus that reduces the input inductance for mounted capacitors as well as minimizing the number of capacitors required.

SUMMARY OF THE INVENTION

To overcome the limitations in the prior art described above, and to overcome other limitations that will become apparent upon reading and understanding the present specification, the present invention discloses a method and apparatus for providing improved loop inductance of decoupling capacitors.

The present invention solves the above-described problems by providing a novel pad and via arrangement that reduces the mounted capacitor's input inductance without violating common manufacturing requirements for certain minimum separations.

A capacitor arrangement in accordance with the principles of the present invention includes a first and second surface mount technology (SMT) mounting pad configured in a predetermined alignment, a first and second breakout via disposed at one side of the SMT mounting pads and adjacent thereto, the first via coupling the first SMT mounting pad to a power plane and the second via coupling the second SMT mounting pad to a ground plane, the first and second vias further having a distance of separation minimized according to allowable manufacturing tolerances and a capacitor coupled to the first and second SMT mounting pads at opposite ends.

In another embodiment of the present invention, a printed circuit board is provided. The printed circuit board includes a plurality of planes including at least one power plane and at least one ground plane, a mounting surface and at least one decoupling capacitor, the at least one decoupling capacitor includes a first and second surface mount technology (SMT) mounting pad configured in a predetermined alignment on the mounting surface, a first and second breakout via disposed at one side of the SMT mounting pads and adjacent thereto, the first via coupling the first SMT mounting pad to at least the one power plane and the second via coupling the second SMT mounting pad to at least the ground plane, the first and second vias further having a distance of separation minimized according to allowable manufacturing tolerances and a capacitor coupled to the first and second SMT mounting pads at opposite ends thereof.

Another embodiment of the present invention is a method for providing improved loop inductance of decoupling capacitors. The method includes forming a first and second surface mount technology (SMT) mounting pad on a surface of a printed circuit board according to a predetermined arrangement, forming a first and second breakout via at one side of the SMT mounting pads and adjacent thereto, the first via being coupled to the first SMT mounting pad and a power plane and the second via being coupled to the second SMT mounting pad and to a ground plane, the forming of the first and second vias further comprising selecting a distance of separation between the first and second vias that is minimized according to allowable manufacturing tolerances and mounting a decoupling capacitor to the first and second SMT mounting pads at opposite ends.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout.

DETAILED DESCRIPTION OF THE INVENTION

In the following description of the exemplary embodiment, reference is made to the accompanying drawings which form a part hereof, and in which is shown by way of illustration the specific embodiment in which the invention may be practiced. It is to be understood that other embodiments may be utilized as structural changes may be made without departing from the scope of the present invention.

The present invention provides a method and apparatus that provides improved loop inductance of decoupling capacitors. Vias are moved close to the pads and close to each other. Instead of placing power and ground vias on opposite sides of the capacitor, these vias are moved around to the same side of the capacitor and are placed as close to each other as via-to-via manufacturing tolerances will allow.

For designs using standard two-terminal surface mount capacitors, two vias per capacitor, and standard manufacturing procedures (no vias inside pads, for example), the present invention provides the lowest possible loop inductance of the capacitor's connections to the printed circuit board planes. This results in the lowest effective capacitor series input inductance.

Figure 1:
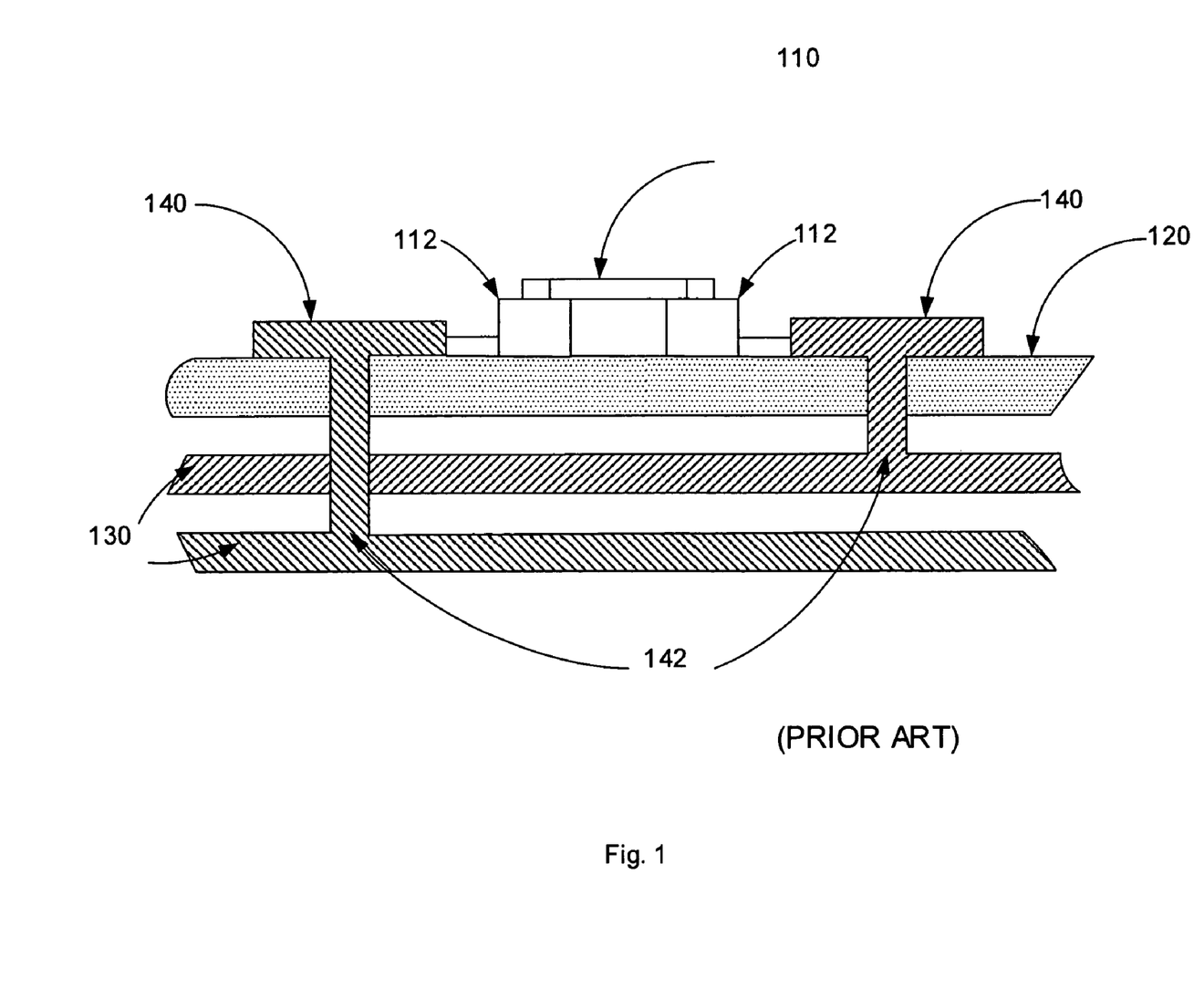
FIG. 1 illustrates the typical technology used for surface mount technology (SMT) decoupling capacitor on printed circuit boards (PCB's)

FIG. 1 illustrates a printed circuit boards (PCB) and the typical technology used for surface mount technology (SMT) decoupling capacitor on PCBs 100. In FIG. 1 a SMT decoupling capacitor 110 and SMT mounting pads 112 are shown on a printed circuit board (PCB) 120. The PCB 120 includes several internal planes 130, such as the power and ground planes. Breakout vias 140 provide layer-to-layer interconnections 142 in multi-layer PCBs 120. Vias 140 are a necessary connection to internal planes 130 that supply current to nearby devices and decouple the power and ground planes 130 to control high frequency noise.

A conventional via 140 in a multi-layer PCB 120 is typically provided by drilling or otherwise forming a hole through the PCB 120. The through hole passes through all planes 130 of the conductive layer traces in the PCB 120 which are intended to be connected. The hole is then plated to form an electrical connection 142 among the conductive traces. In this manner, electrical connections between planes 130 of multi-layer PCBs are provided. This process provides a signal path through which a single signal propagates between planes 130 of a PCB 120. Connections 142 to conductive traces or signal paths in each of the PCB planes 130 can be made. Vias 140 conserves space on the PCB 120 and thus allows the PCB 120 to be more densely populated.

Figure 2:
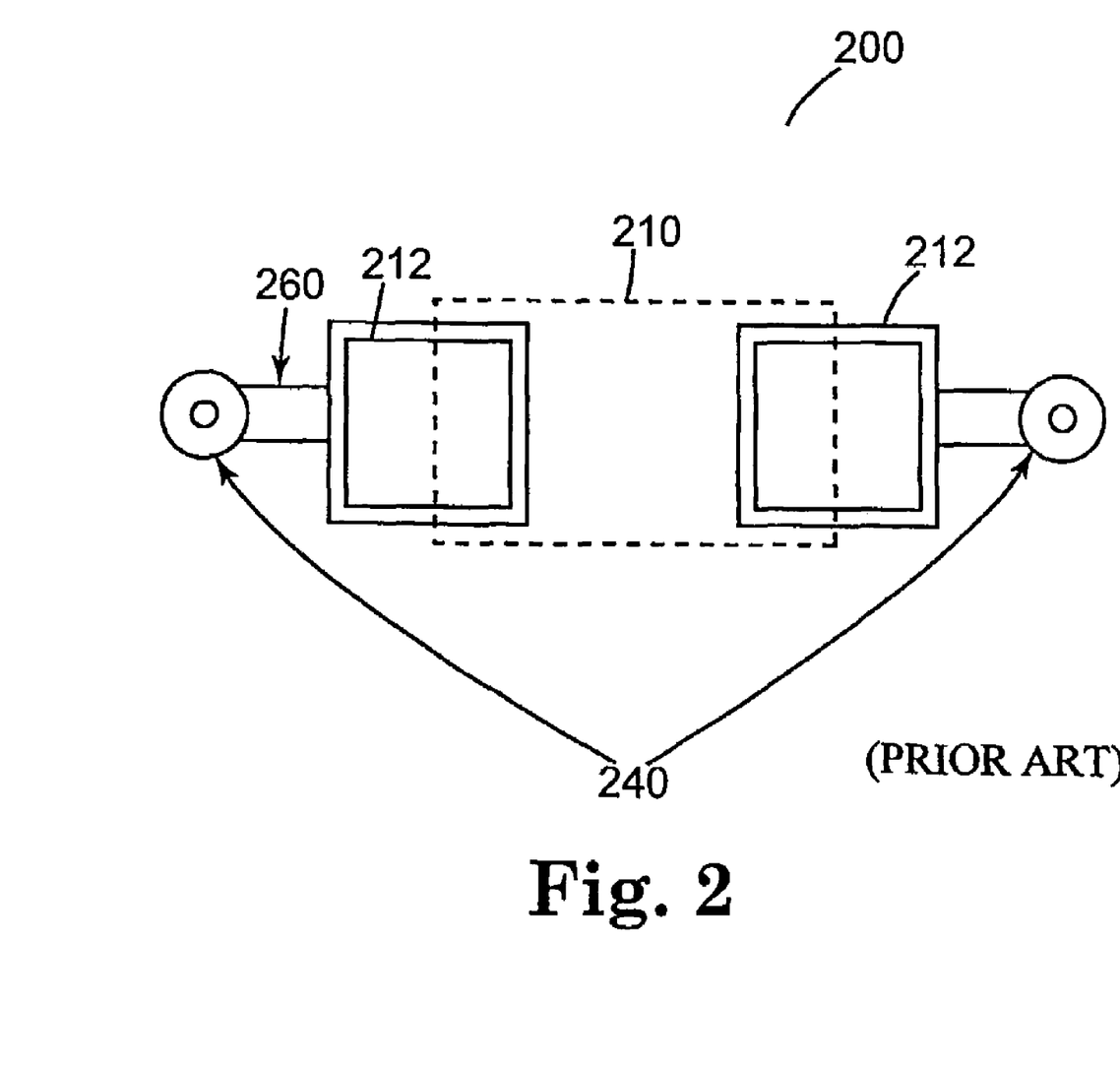
FIG. 2 shows the prior method for forming decoupling capacitors.

FIG. 2 shows the prior method 200 for forming SMT decoupling capacitors. In FIG. 2, the breakout vias 240 are disposed outside the mounting pads 212 on opposite ends of the capacitor 210. As shown in FIG. 2, the vias 240 are well separated from the mounting pads 212 by a solder-masked thin conductor 260 to prevent the molten solder from being removed from the solder zone by capillary action. The arrangement 200 is preferred from a manufacturing prospective. However, the via-to-plane distances for the return current is too great and therefore results in weak decoupling and high frequency noise.

Figure 3:
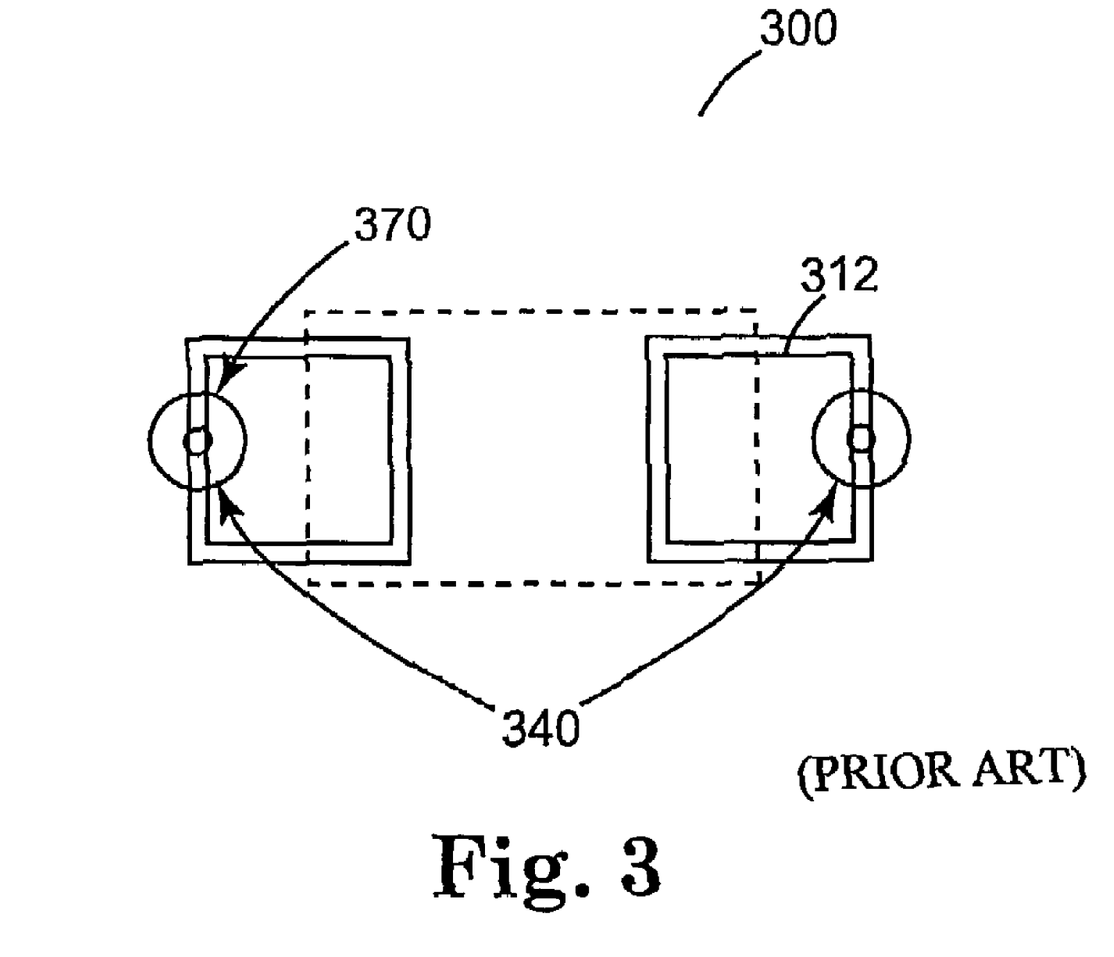
FIG. 3 illustrates the via in pad capacitor arrangement.

FIG. 3 illustrates the via-in-pad SMT capacitor arrangement 300. In FIG. 3, vias 340 are formed on the mounting pads 312. This arrangement 300 is more aggressive and is used for high performance designs. The via-to-plane distances for the return current are improved and therefore provide improved decoupling. However this arrangement 300 results in solder thieving 370 at manufacturing and is thus more costly.

Figure 4:
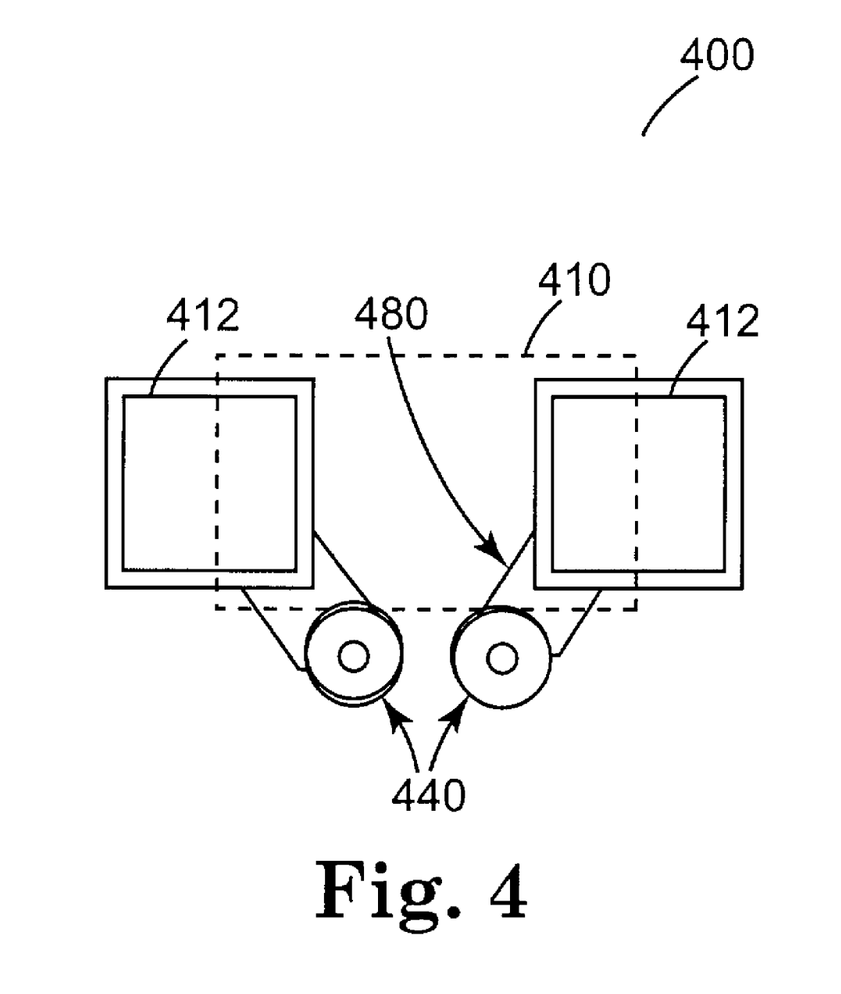
FIG. 4 illustrates the capacitor/pad/via arrangement for providing improved loop inductance of decoupling capacitors according to the present invention.

FIG. 4 illustrates the capacitor/pad/via arrangement 400 for providing improved loop inductance of decoupling capacitors according to the present invention. A first of the vias 440 is formed to penetrate and couple a first of the mounting pads 412 to a power plane (not shown in FIG. 4, but see FIG. 1 for layer-to-layer interconnections) and a second of the vias 440 is formed to penetrate and couple a second of the mounting pads 412 to a ground plane. The first and second vias have a separation there between selected to be the smallest possible. In fact, the vias 440 are placed as close to each other as manufacturing tolerances will allow. These tolerances may take into account the need for high wire densities, which is referred to as the wireability of the board.

In FIG. 4, the vias 440 are moved close to the mounting pads 412 and close to each other on the same side of the capacitor 410 and mounting pads 412. However, in contrast to the vias 340 shown in FIG. 3, the vias 440 are not drilled through the mounting pads 412, but are separate therefrom. The vias 440 are also separate from the capacitor 410. The vias 440 are separated from the mounting pads 212 by a solder-masked thin conductor 480. A sufficient mask web between the pad and via edge prevents solder thieving during the manufacturing of the decoupling capacitor. Unlike the prior techniques shown in FIGS. 2-3, the via-to-plane distances are minimized to provide the closest proximity and therefore provide the optimum return current and to reduce noise.

As shown in FIG. 4, for designs using standard two-terminal surface mount capacitors (i.e., two vias per capacitor) and standard manufacturing procedures (no vias inside pads, for example), the present invention provides the lowest possible loop inductance (minimum) of the capacitor's connections to the printed circuit board planes. This results in the lowest effective capacitor series input inductance, which provides optimum decoupling as well as avoiding costly manufacturing issues as discussed above.

Figure 5:
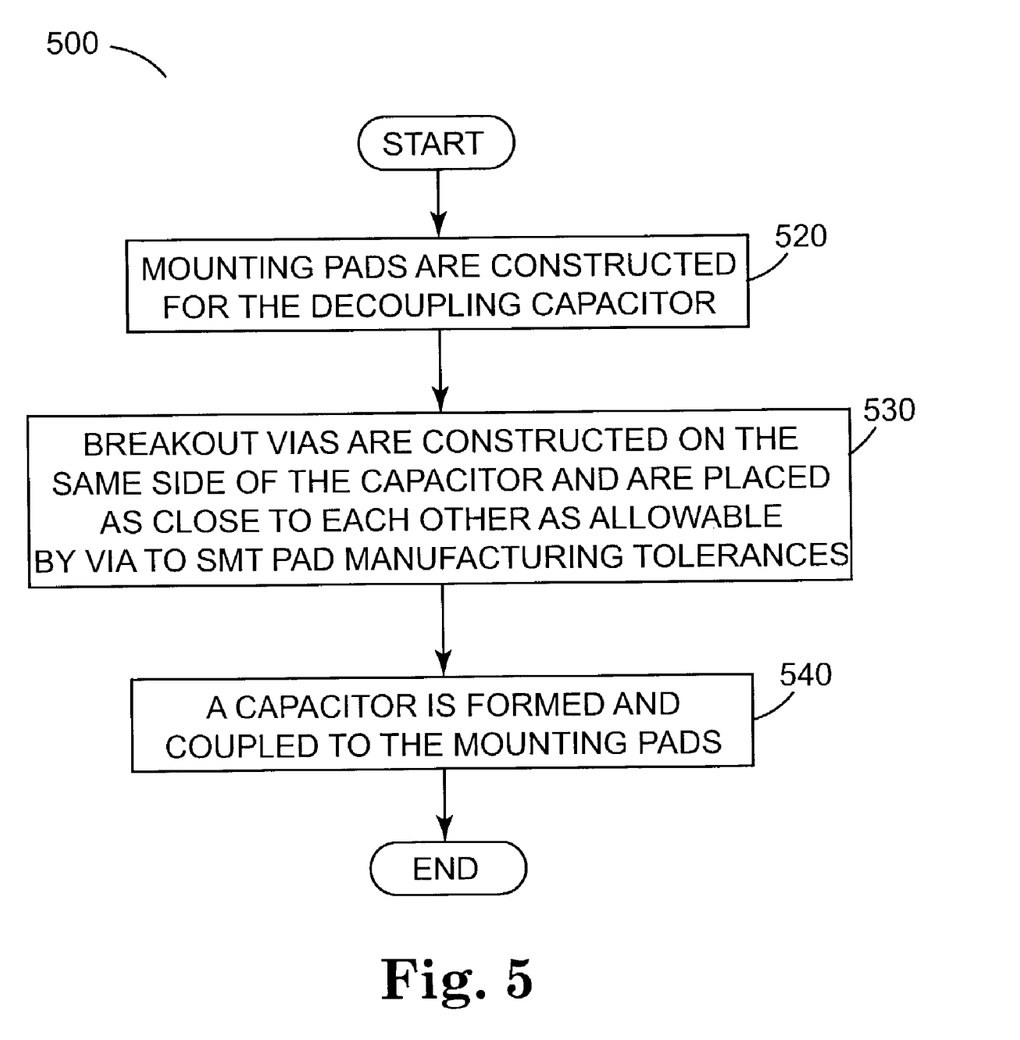
FIG. 5 is a flow chart for the method for providing improved loop inductance of decoupling capacitors according to the present invention.

FIG. 5 is a flow chart 500 for the method for providing improved loop inductance of decoupling capacitors according to the present invention. In FIG. 5, mounting pads are constructed for the decoupling capacitor 520. Breakout vias are formed on the same side of the mounting pads (but separate from the mounting pads) and are placed as close to each other as allowable by via-to-via manufacturing tolerances 530 (as shown in FIG. 4). A capacitor is formed and coupled to the mounting pads 540. The present invention is not limited to the order of the above steps, but typically the capacitor is formed last.

Therefore, the present invention provides a novel pad and via arrangement which reduces the mounted capacitor's input inductance without violating common manufacturing requirements for certain minimum separations. The arrangement according to the present invention reduces the input inductance for mounted capacitors, minimizes the number of capacitors required and reduces the high frequency noise.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A capacitor arrangement, comprising:
a first and second mounting pad, each comprising a surface mount technology (SMT) pad;
a first via disposed proximate, but separate from, the first mounting pad and coupled to the first mounting pad by a first conductor, the first via providing a pathway to a ground plane layer;
a second via disposed proximate, but separate from, the second mounting pad and coupled to the second mounting pad by a second conductor, the second via providing a pathway to a power plane layer, the power plane layer being non-planar with the ground plane layer; and
a first and second lead formed in the first and second via to connect the first conductor to the ground plane and to connect the second conductor to the power plane;
wherein the first conductor is angled from the first mounting pad in a direction of the second via and the second conductor is angled from the second mounting pad in a direction of the first via, wherein a separation between the first via and the second via is reduced by the angling of the first and second conductor and the separation between the first via and the second via is configured to be substantially minimized irrespective of a separation between the first and second mounting pad.

2. The capacitor arrangement of claim 1, wherein the first mounting pad includes a first and second side and the second mounting pad includes a first and second side, the first side of the first mounting pad facing the first side of the second mounting pad, the second side of the first mounting pad and the second side of the second mounting pad facing a same direction, the first via being disposed on the second side of the first mounting pad and the second via being disposed on the second side of the second mounting pad.

3. capacitor arrangement of claim 1, wherein the manufacturing tolerances take into account wireability.

4. The capacitor arrangement of claim 1, wherein the manufacturing tolerances comprise the via-to-via tolerances.

5. The capacitor arrangement of claim 1, wherein the manufacturing tolerances comprise the via-to-pad tolerances.

6. The capacitor arrangement of claim 1, wherein the first and second vias are separated from the SMT mounting pads of the first and second mounting pad areas by a solder mask.

7. The capacitor arrangement of claim 6, wherein the solder mask provides a thermal barrier between the SMT mounting pads of the first and second mounting pad areas and the first and second vias.

8. The capacitor arrangement of claim 1, wherein the first and second vias are disposed as close to the SMT mounting pads of the first and second mounting pad areas as allowed by manufacturing tolerances.

9. The capacitor arrangement of claim 8, wherein the spacing between the first and second vias and the SMT mounting pads of the first and second mounting pad areas provides a minimum loop inductance for the capacitor arrangement.

10. The capacitor arrangement of claim 1, wherein the first and second mounting pad comprises a first and second mounting means, each comprising a surface mount technology (SMT) means, wherein the first via is disposed proximate, but separate from, the first mounting means and coupled to the first mounting means by a first conducting means and the second via is disposed proximate, but separate from, the second mounting means and coupled to the second mounting means by a second conducting means, wherein the first conducting means is angled from the first mounting means in a direction of the second via and the second conducting means is angled from the second mounting means in a direction of the first via, wherein a separation between the first via and the second via is reduced by the angling of the first and second conducting means and the separation between the first via and the second via is configured to be substantially minimized irrespective of a separation between the first and second mounting means.

11. A printed circuit board, comprising:
a plurality of planes including at least one power plane and at least one ground plane, the at least one power plane layer being non-planar with the at least one ground plane layer;
a mounting surface; and
at least one decoupling capacitor, the at least one decoupling capacitor comprising:
a first and second mounting pad, each comprising a surface mount technology (SMT) pad;
a first via disposed proximate, but separate from, the first mounting pad and coupled to the first mounting pad by a first conductor, the first via providing a pathway to the at least one ground plane;
a second via disposed proximate, but separate from, the second mounting pad and coupled to the second mounting pad by a second conductor, the second via providing a pathway to the at least one power plane; and
a first and second lead formed in the first and second via to connect the first conductor to the ground plane and to connect the second conductor to the power plane;
a capacitor coupled to the first and second SMT mounting pads of the first and second mounting pad areas at opposite ends thereof;
wherein the first conductor is angled from the first mounting pad in a direction of the second via and the second conductor is angled from the second mounting pad in a direction of the first via, wherein a separation between the first via and the second via is reduced by the angling of the first and second conductor and the separation between the first via and the second via is configured to be substantially minimized irrespective of a separation between the first and second mounting pad.

12. The printed circuit board of claim 11, wherein the first mounting pad includes a first and second side and the first mounting pad includes a first and second side, the first side of the first mounting pad facing the first side of the second mounting pad, the second side of the first mounting pad and the second side of the second mounting pad facing a same direction, the first via being disposed on the second side of the first mounting pad and the second via being disposed on the second side of the second mounting pad.

13. The printed circuit board of claim 11, wherein the manufacturing tolerances take into account wireability.

14. The printed circuit board of claim 11, wherein the manufacturing tolerances comprise the via-to-via tolerances.

15. The printed circuit board of claim 11, wherein the manufacturing tolerances comprise the via-to-pad tolerances.

16. The printed circuit board of claim 11, wherein the first and second vias are separated from the SMT mounting pads of the first and second mounting pad areas by a solder mask.

17. The printed circuit board of claim 16, wherein the solder mask provides a thermal barrier between the SMT mounting pads of the first and second mounting pad areas and the first and second vias.

18. The printed circuit board of claim 11, wherein the first and second vias are disposed as close to the SMT mounting pads of the first and second mounting pad areas as allowed by manufacturing tolerances.

19. The printed circuit board of claim 18, wherein the spacing between the first and second vias and the SMT mounting pads of the first and second mounting pad areas provides a minimum loop inductance for the capacitor arrangement.

20. A method for providing improved loop inductance of decoupling capacitors, comprising:
    providing a plurality of planes including at least one power plane and at least one ground plane, the power plane layer being non-planar with the ground plane layer;
    providing a first and second mounting pad over the plurality of planes, each mounting pad comprising a surface mount technology (SMT) pad;
    providing a first via disposed proximate, but separate from, the first mounting pad and coupled to the first mounting pad by a first conductor , the first via providing a pathway to a ground plane;
    providing a second via disposed proximate, but separate from, the second mounting pad and coupled to the second mounting pad by a second conductor, the second via providing a pathway to a power plane;
    forming a first and second lead in the first and second via to connect the first conductor to the ground plane and to connect the second conductor to the power plane;
    angling the first conductor from the first mounting pad in a direction of the second via and angling the second conductor from the second mounting pad in a direction of the first via to reduce a separation between the first via and the second via irrespective of a separation between the first and second mounting pad; and
    mounting a decoupling capacitor to the first and second SMT mounting pads of the first and second mounting pad areas at opposite ends.

21. The method of claim 20, wherein the providing first mounting pad includes providing a first mounting pad having a first and second side and the providing second mounting pad includes providing a second mounting pad having a first and second side, and further comprising facing the first side of the first mounting pad to the first side of the second mounting pad, facing the second side of the first mounting pad and the second side of the second mounting pad in a same direction, disposing the first via being on the second side of the first mounting pad and disposing the second via on the second side of the second mounting pad.

22. The method of claim 20, wherein the angling further comprising selecting a distance of separation between the first and second vias that is minimized according to allowable manufacturing tolerances further comprises taking into account wireability for the printed circuit board.

23. The method of claim 22, wherein the selecting a distance of separation between the first and second vias that is minimized according to allowable manufacturing tolerances further comprises taking into account the via-to-via tolerances.

24. The method of claim 22, wherein the selecting a distance of separation between the first and second vias that is minimized according to allowable manufacturing tolerances further comprises taking into account the via-to-pad tolerances.

25. The method of claim 20 further comprising separating the first and second vias from the SMT mounting pads of the first and second mounting pad areas by a solder mask.

* * * * *